(12) United States Patent
Yoshida et al.

(10) Patent No.: US 11,729,911 B2
(45) Date of Patent: *Aug. 15, 2023

(54) PRINTED WIRING BOARD AND METHOD FOR MANUFACTURING THE SAME

(71) Applicant: IBIDEN CO., LTD., Gifu (JP)

(72) Inventors: Akinori Yoshida, Ogaki (JP); Katsuhiko Tanno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,038

(22) Filed: Feb. 17, 2022

(65) Prior Publication Data

US 2022/0174815 A1 Jun. 2, 2022

Related U.S. Application Data

(63) Continuation of application No. 17/030,947, filed on Sep. 24, 2020, now Pat. No. 11,363,714.

(30) Foreign Application Priority Data

Sep. 25, 2019 (JP) .................................. 2019-174477

(51) Int. Cl.
*H05K 3/40* (2006.01)
*H05K 1/11* (2006.01)
*H05K 3/34* (2006.01)
*H05K 3/46* (2006.01)

(52) U.S. Cl.
CPC ............... *H05K 1/111* (2013.01); *H05K 3/34* (2013.01); *H05K 3/4007* (2013.01); *H05K 3/4605* (2013.01)

(58) Field of Classification Search
CPC ........ H05K 1/111; H05K 3/34; H05K 3/4007; H05K 3/4605; H05K 3/244
See application file for complete search history.

(56) References Cited

U.S. PATENT DOCUMENTS

| | | | |
|---|---|---|---|
| 10,453,817 B1 * | 10/2019 | Dadvand | .................. C25D 5/12 |
| 2014/0183726 A1 * | 7/2014 | Lee | ........................ H01L 25/105 |
| | | | 257/737 |
| 2016/0100484 A1 * | 4/2016 | Kunieda | ........... H01L 23/49811 |
| | | | 174/250 |

FOREIGN PATENT DOCUMENTS

JP 2010-129996 A 6/2010

* cited by examiner

*Primary Examiner* — Sherman Ng
(74) *Attorney, Agent, or Firm* — Oblon, McClelland, Maier & Neustadt, L.L.P.

(57) ABSTRACT

A printed wiring board includes a base insulating layer, a conductor layer formed on the base layer and including conductor pads, an underlayer formed on one of the conductor pads and including a metal different from a metal of the conductor layer, a solder resist layer formed on the base layer such that the solder resist layer is covering the conductor layer and has openings exposing the conductor pads, and a bump formed directly on a first conductor pad of the conductor pads and including a base plating layer formed in a first opening of the openings and a top plating layer formed on the base plating layer such that a metal of the base plating layer is same as the metal of the conductor layer. The conductor pads include a second conductor pad such that the second conductor pad is the one of the conductor pads having the underlayer.

20 Claims, 4 Drawing Sheets ically a printed wiring board of an embodiment of the present invention;

PRINTED WIRING BOARD AND METHOD FOR MANUFACTURING THE SAME

CROSS-REFERENCE TO RELATED APPLICATIONS

The present application is a continuation of and claims the benefit of priority to U.S. patent application Ser. No. 17/030,947, filed Sep. 24, 2020, which is based upon and claims the benefit of priority to Japanese Patent Application No. 2019-174477, filed Sep. 25, 2019. The entire contents of these applications are incorporated herein by reference.

BACKGROUND OF THE INVENTION

Field of the Invention

The present invention relates to a printed wiring board having plating bumps and a method for manufacturing the printed wiring board.

Description of Background Art

Japanese Patent Application Laid-Open Publication No. 2010-129996 describes bump formation using a plating method. The entire contents of this publication are incorporated herein by reference.

SUMMARY OF THE INVENTION

According to one aspect of the present invention, a printed wiring board includes a base insulating layer, a conductor layer formed on the base insulating layer and including conductor pads, an underlayer formed on one of the conductor pads of the conductor layer and including a metal different from a metal of the conductor layer, a solder resist layer formed on the base insulating layer such that the solder resist layer is covering the conductor layer and has openings exposing the conductor pads, respectively, and a bump formed directly on a first conductor pad of the conductor pads and including a base plating layer formed in a first opening of the openings and a top plating layer formed on the base plating layer such that a metal of the base plating layer is same as the metal of the conductor layer.

According to another aspect of the present invention, a method for manufacturing a printed wiring board includes forming a conductor layer on a base insulating layer such that the conductor layer includes conductor pads, forming a solder resist layer on the base insulating layer such that the solder resist layer covers the conductor layer and that the solder resist layer has openings exposing the conductor pads, respectively, forming on one of the conductor pads of the conductor layer an underlayer including a metal that is different from a metal of the conductor layer, and forming directly on a first conductor pad of the conductor pads a bump including a base plating layer and a top plating layer. The forming of the bump includes forming the base plating layer in a first opening of the openings and forming the top plating layer on the base plating layer such that a metal of the base plating layer is same as the metal of the conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
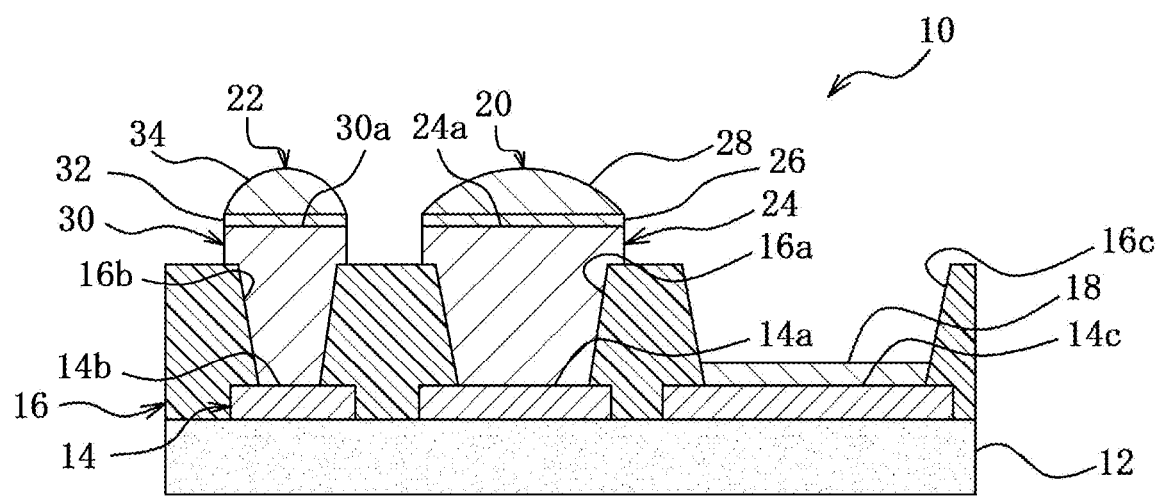
FIG. 1 is a cross-sectional view illustrating a printed wiring board of an embodiment of the present invention.

Embodiments will now be described with reference to the accompanying drawings, wherein like reference numerals designate corresponding or identical elements throughout the various drawings.

Printed Wiring Board

FIG. 1 illustrates an enlarged view of a portion of a printed wiring board 10 of the embodiment. The printed wiring board 10 may be a substrate with a core formed by alternately laminating conductor layers and resin insulating layers on one side or both sides of a core substrate (not illustrated in the drawings), the conductor layers each having a predetermined circuit pattern. In the case where the conductor layers are formed on both sides of the core substrate, conductor layers opposing each other via the core substrate may be connected to each other via through-hole conductors (not illustrated in the drawings). Alternatively, the printed wiring board 10 may be a coreless substrate obtained by alternately laminating conductor layers and resin insulating layers on a support plate (not illustrated in the drawings) instead of a core substrate, and then removing the support plate. In any case, as illustrated in FIG. 1, the printed wiring board 10 includes at least a base insulating layer 12 which is positioned the outermost among the resin insulating layers, a conductor layer 14 which is formed on the base insulating layer 12 and has a predetermined circuit pattern, and a solder resist layer 16 which is formed on the base insulating layer 12 and the conductor layer 14. Other multiple conductor layers and multiple resin insulating layers are often alternately provided below the base insulating layer 12, but are omitted in the drawings. However, it is also possible that the printed wiring board 10 is formed of one insulating layer (the base insulating layer 12) and one conductor layer (the conductor layer 14).

The base insulating layer 12 can be formed of, for example, a resin composition or the like containing an inorganic filler, such as silica or alumina, and an epoxy resin. The conductor layer 14 is formed of a conductive metal, for example, a metal containing copper as a main component.

The solder resist layer 16 has a first opening (16a) exposing a portion of the conductor layer 14 as a first conductor pad (14a), a second opening (16b) having a smaller diameter than the first opening (16a) and exposing another portion of the conductor layer 14 as a second conductor pad (14b), and a third opening (16c) having, for example, a larger diameter than the first opening (16a) and exposing yet another portion of the conductor layer 14 as a third conductor pad (14c). An aspect ratio of the first opening (16a), that is, a ratio of a depth to a diameter at a bottom thereof can be set to 0.5 or less. An aspect ratio of the second opening (16b), that is, a ratio of a depth to a diameter at a bottom thereof can be set to 0.6 or more.

An underlayer 18 is formed on the third conductor pad (14c). As the underlayer 18, for example, a nickel layer formed on a surface of the third conductor pad (14c), a palladium layer formed on the nickel layer, and a gold layer formed on the palladium layer can be exemplified. In addition, a nickel layer and a gold layer formed on the nickel layer can be exemplified.

The printed wiring board 10 further includes a first bump 20 which is formed on the first conductor pad (14a), and a second bump 22 which is formed on the second conductor pad (14b) and has a smaller diameter than the first bump 20. The first and second bumps (20, 22) are respectively formed directly on the first and second conductor pads (14a, 14b) without the underlayer 18. The first bump 20 can be used for connecting to a power source or a ground line. The second bump 22 having a smaller diameter than the first bump 20 can be used for connecting to a signal line. The third conductor pad (14c) can be used, for example, for connecting to a terminal of an electronic component such as a capacitor via the underlayer 18.

The first bump 20 has a first base plating layer 24 formed in the first opening (16a), and a first top plating layer 28 formed in a substantially hemispherical shape on the first base plating layer 24 via a first intermediate layer 26 containing, for example, nickel as a main component. The first intermediate layer 26 preferably has a thickness of 7 μm or less.

The first base plating layer 24 is formed of the same conductive metal as the conductor layer 14, for example, a metal containing copper as a main component. The first base plating layer 24 is formed to a height exceeding a surface of the solder resist layer 16 (a surface on an opposite side with respect to the base insulating layer 12). As a result, the first bump 20 is stably held in the first opening (16a). A height measured from the surface of the solder resist layer 16 to an upper end surface (24a) of the first base plating layer 24 is preferably in a range of 3 μm-15 μm.

The first top plating layer 28 is formed of a metal which has a lower melting point than the first base plating layer 24 and which is melted by a reflow treatment and is shaped into a substantially hemispherical shape as illustrated in FIG. 1, for example, a metal containing tin as a main component. A thickness of the first top plating layer 28 (a distance in a vertical direction from a lower end of the first top plating layer 28 to a top of the first top plating layer on an outer peripheral surface of the first bump 20) is preferably in a range of 20 μm-40 μm. By setting the thickness of the first top plating layer 28 in this range, good connection reliability can be achieved between the first bump 20 and a connection pad (not illustrated in the drawings) of an electronic component such as a semiconductor chip or a memory mounted on the printed wiring board 10.

The second bump 22 has a second base plating layer 30 formed in the second opening (16b), and a second top plating layer 34 formed in a substantially hemispherical shape on the second base plating layer 30 via a second intermediate layer 32 containing, for example, nickel as a main component. The second intermediate layer 32 preferably has a thickness of 7 μm or less.

The second base plating layer 30 is formed of the same conductive metal as the conductor layer 14, for example, a metal containing copper as a main component. The second base plating layer 30 is formed to a height exceeding the surface of the solder resist layer 16 (the surface on an opposite side with respect to the base insulating layer 12). As a result, the second bump 22 is stably held in the second opening (16b). A height measured from the surface of the solder resist layer 16 to an upper end surface (30a) of the second base plating layer 30 is preferably in a range of 3 μm-15 μm.

The second top plating layer 34 is formed of a metal which has a lower melting point than the second base plating layer 30 and which is melted by a reflow treatment and is shaped into a substantially hemispherical shape as illustrated in FIG. 1, for example, a metal containing tin as a main component. A thickness of the second top plating layer 34 (a distance in the vertical direction from a lower end of the second top plating layer 34 to a top of the second top plating layer 34 on an outer peripheral surface of the second bump 22) is preferably set in a range of 20 μm-40 μm. By setting the thickness of the second top plating layer 34 in this range, good connection reliability can be achieved between the second bump 22 and a connection pad (not illustrated in the drawings) of an electronic component such as a semiconductor chip or a memory mounted on the printed wiring board 10.

In the printed wiring board 10 of the embodiment shown in FIG. 1, the first base plating layer 24 and the second base plating layer 30 are formed together, and the upper end surface (24a) of the first base plating layer 24 and the upper end surface (30a) of the second base plating layer 30 have the same height as each other. Further, the first intermediate layer 26 and the second intermediate layer 32 are formed together and have the same thickness (height) as each other.

Then, the first top plating layer 28 and the second top plating layer 34 are formed together and are adjusted in their metal plating amounts and have the same thickness (height) as each other after melting by a reflow treatment.

As a result, in the printed wiring board 10 of the embodiment illustrated in FIG. 1, even when the bumps (20, 22) of different sizes are provided, the bump 20 and the bump 22 have substantially the same in height. In addition, the first and second base plating layers (24, 30) are formed of the same conductive metal as the conductor layer 14 forming the first and second conductor pads (14a, 14b), for example, a metal containing copper as a main component, and are respectively directly formed on the first and second conductor pads (14a, 14b). Therefore, the base plating layers (24, 30) and thus the first and second bumps (20, 22) have sufficiently high connection reliability with respect to the conductor pads (14a, 14b).

Method for Manufacturing Printed Wiring Board

In the following, a method for manufacturing a printed wiring board according to an embodiment of the present invention is described with reference to FIGS. 2A-2H for manufacturing the printed wiring board 10 illustrated in FIG. 1.

Figure 2A:
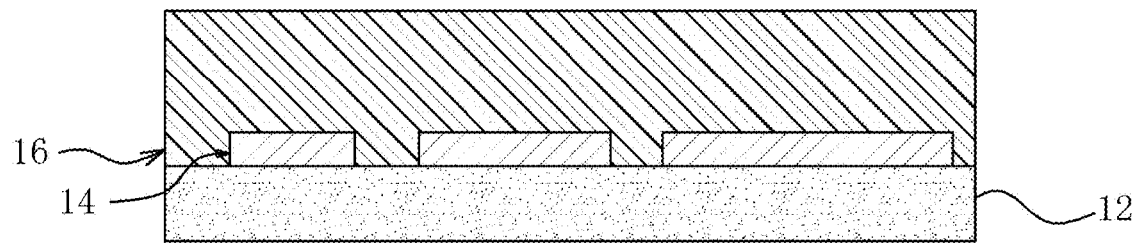
FIG. 2A is a cross-sectional view illustrating a method for manufacturing a printed wiring board according to an embodiment of the present invention.

FIG. 2A illustrates an intermediate in which the conductor layer 14 and the solder resist layer 16 are formed on the base insulating layer 12 using a common method, the conductor layer 14 having a predetermined circuit pattern. Other multiple conductor layers and multiple resin insulating layers are often alternately formed below the base insulating layer 12, but are omitted in the drawings. The multiple conductor layers and the multiple resin insulating layers can be laminated on a core substrate or on a support plate that can be removed afterwards. However, it is also possible that the printed wiring board 10 is formed from one resin insulating layer as the base insulating layer 12 and one conductor layer as the conductor layer 14. In this case, the resin insulating layer corresponds to the base insulating layer 12. For the base insulating layer 12, an insulating resin film for a build-up layer containing inorganic filler such as silica or alumina and an epoxy resin can be used.

Figure 2B:
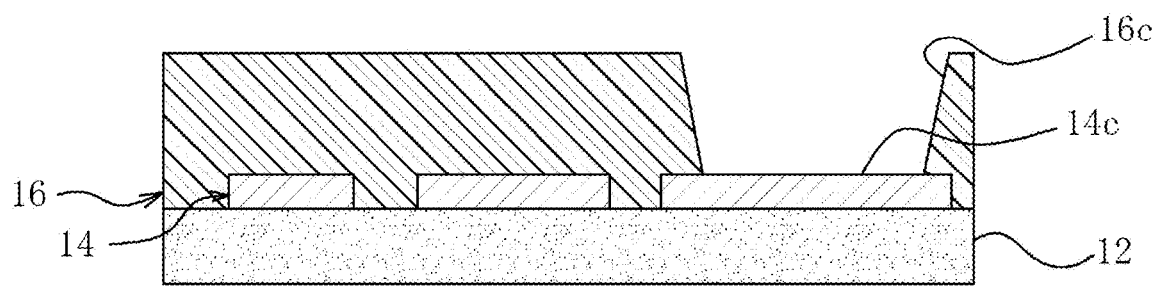
FIG. 2B is a cross-sectional view illustrating the method for manufacturing a printed wiring board according to the embodiment.

As illustrated in FIG. 2B, the third opening (16c) exposing a portion of the conductor layer 14 as the third conductor pad (14c) is first formed in the solder resist layer 16 using, for example, $CO_2$ laser, UV-YAG laser, or the like.

Figure 2C:
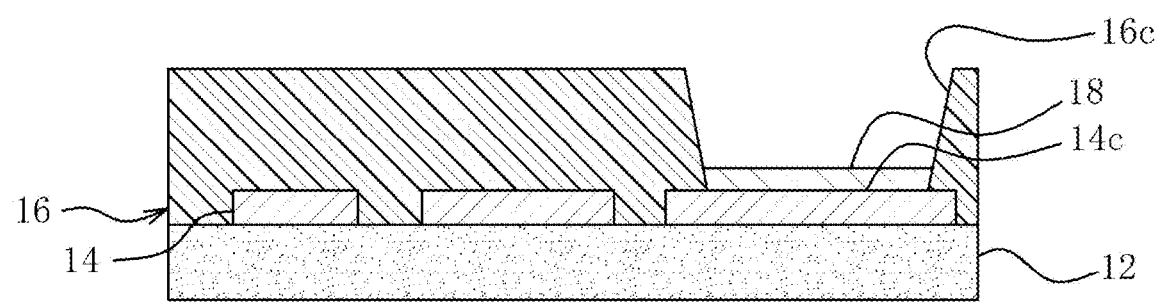
FIG. 2C is a cross-sectional view illustrating the method for manufacturing a printed wiring board according to the embodiment.

As illustrated in FIG. 2C, the underlayer 18 is formed on the third conductor pad (14c), for example, by laminating a nickel layer, a palladium layer, and a gold layer in this order by plating.

Figure 2D:
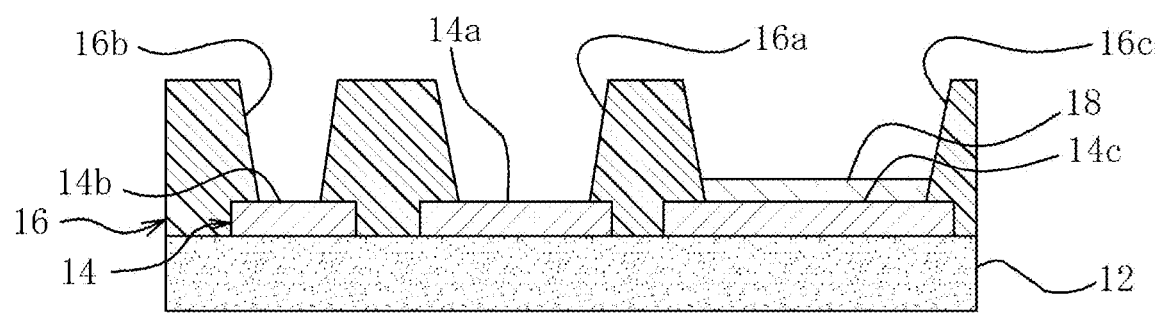
FIG. 2D is a cross-sectional view illustrating the method for manufacturing a printed wiring board according to the embodiment.

As illustrated in FIG. 2D, next, the first opening (16a) exposing another portion of the conductor layer 14 as the first conductor pad (14a) and the second opening (16b) exposing yet another portion of the conductor layer 14 as the second conductor pad (14b) are formed in the solder resist layer 16, for example, using $CO_2$ laser, UV-YAG laser or the like.

Figure 2E:
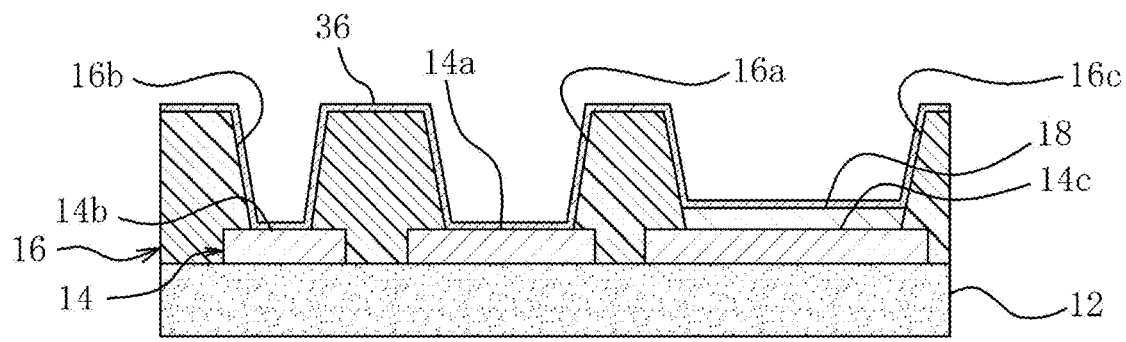
FIG. 2E is a cross-sectional view illustrating the method for manufacturing a printed wiring board according to the embodiment.

As illustrated in FIG. 2E, for example, an electroless plating treatment such as an electroless copper plating treatment is performed, and a seed layer 36 is formed on the surface of the solder resist layer 16 of the intermediate, on side surfaces of the first, second and third openings (16a, 16b, 16c), and on the conductor pads (14a, 14b).

Figure 2F:
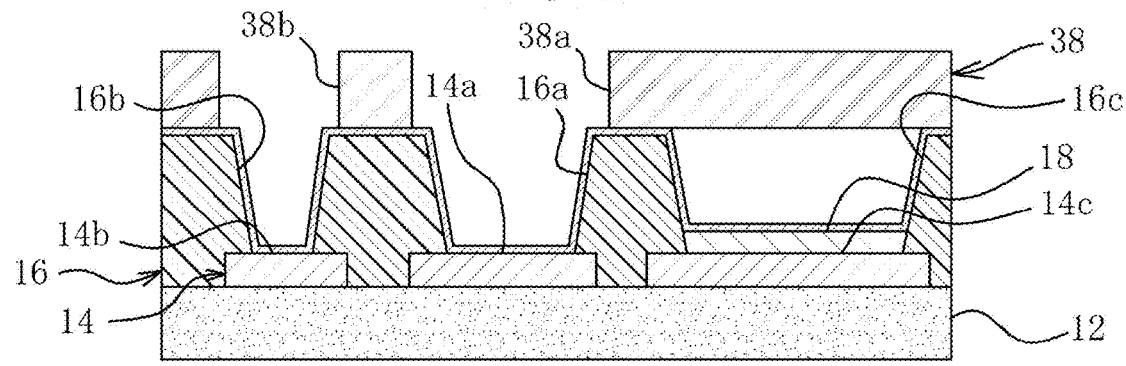
FIG. 2F is a cross-sectional view illustrating the method for manufacturing a printed wiring board according to the embodiment.

As illustrated in FIG. 2F, a plating resist 38 of a predetermined pattern that is formed of, for example, a dry film resist and has openings (38a, 38b) at planned formation sites of the first and second bumps (20, 22) (FIG. 1) is formed on the seed layer 36.

Figure 2G:
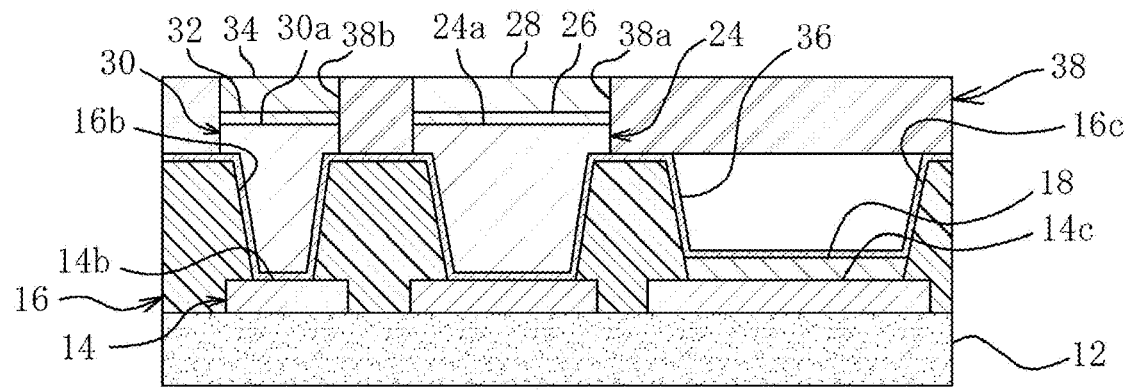
FIG. 2G is a cross-sectional view illustrating the method for manufacturing a printed wiring board according to the embodiment.

As illustrated in FIG. 2G, an electrolytic plating treatment is performed, and the first base plating layer 24 and the second base plating layer 30, which contain a conductive metal of the same kind as the conductor layer 14 forming the first and second conductor pads (14a, 14b), for example, copper as a main component, are formed on portions of the seed layer 36 exposed in the openings (38a, 38b) of the plating resist 38 (including portions of the seed layer 36 in first and second openings (16a, 16b) of the solder resist layer 16 and remaining exposed portions of the seed layer 36 in the openings (38a, 38b) of the plating resist 38). The heights measured from the surface of the solder resist layer 16 to the upper end surfaces (24a, 30a) of the first and second base plating layers (24, 30) are substantially the same.

As illustrated in FIG. 2G, further, for example, an electrolytic plating treatment is performed, and the first and second intermediate layers (26, 32) containing, for example, nickel as a main component are formed on the upper end surfaces (24a, 30a) of the first and second base plating layers (24, 30) in the openings (38a, 38b) of the plating resist 38.

The thicknesses of the first and second intermediate layers (26, 32) are each preferably 7 μm or less, and are substantially the same as each other.

As illustrated in FIG. 2G, further, for example, an electrolytic plating treatment is performed, and the first and second top plating layers (28, 34) are formed on the upper end surfaces (24a, 30a) of the first and second base plating layers (24, 30) in the openings (38a, 38b) of the plating resist 38 with the first and second intermediate layers (26, 32) interposed therebetween. The first and second top plating layers (28, 34) are each formed of a metal which has a lower melting point than the first and second base plating layers (24, 30) and which is melted by a reflow treatment and is shaped into a substantially hemispherical shape, for example, a metal containing tin as a main component. The heights of the first and second top plating layers (28, 34) after a reflow treatment are preferably each in a range of 20 μm-40 μm and are substantially the same as each other.

Figure 2H:
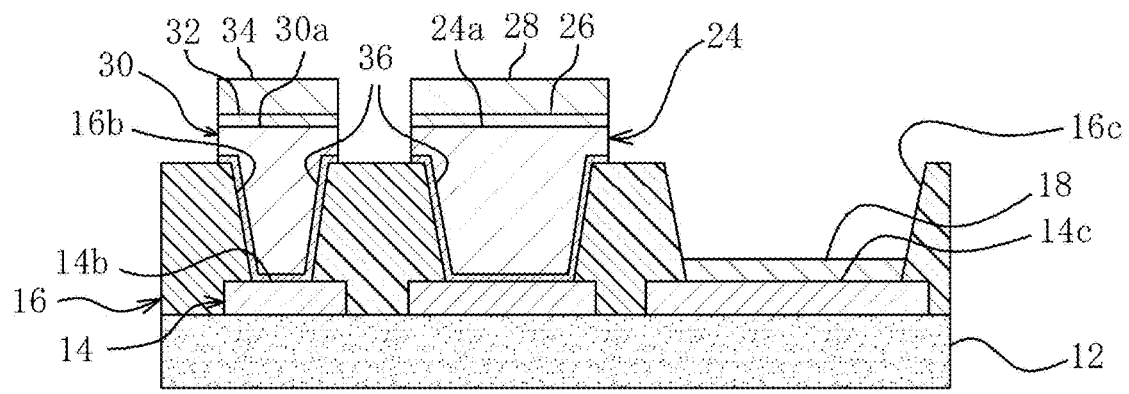
FIG. 2H is a cross-sectional view illustrating the method for manufacturing a printed wiring board according to the embodiment.

As illustrated in FIG. 2H, the plating resist 38 is peeled off. Further, a portion of the seed layer 36 exposed by the removal of the plating resist 38 is removed by etching.

As illustrated in FIG. 1, a reflow treatment is performed, and the first top plating layer 28 and the second top plating layer 34 are shaped into substantially hemispherical shapes. Due to the reflow treatment, the first bump 20 and second bump 22 are formed each including, from a side close to the first and second conductor pads (14a, 14b), for example, a copper base plating layer, a nickel intermediate layer, and a tin top plating layer, and the heights of the first and second bumps (20, 22) are substantially the same as each other. In FIG. 1, illustration of the seed layer 36 is omitted.

Further, the first and second base plating layers (24, 30) are formed of the same conductive metal as the conductor layer 14 forming the first and second conductor pads (14a, 14b), for example, a metal containing copper as a main component, and are respectively directly formed on the first and second conductor pads (14a, 14b). Therefore, the base plating layers (24, 30) and thus the first and second bumps (20, 22) have sufficiently high connection reliability with respect to the conductor pads (14a, 14b).

Figure 3:
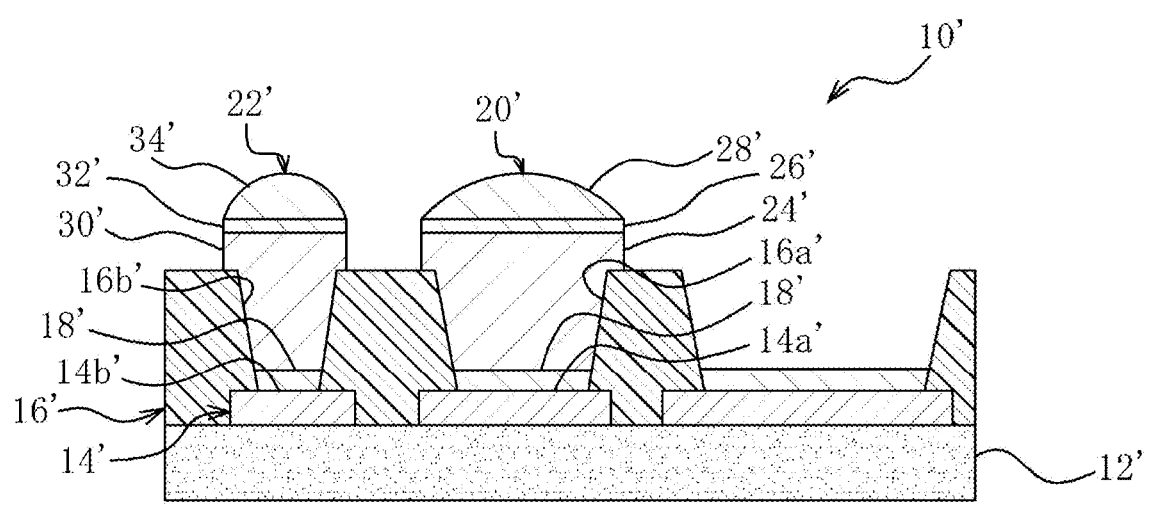
FIG. 3 is a cross-sectional view illustrating a printed wiring board according to a conventional technology.

As illustrated in FIG. 3, when plating bumps (20', 22') are formed by forming a conductor layer (14') on a base insulating layer (12') of a printed wiring board (10'), forming a solder resist layer (16') on the base insulating layer (12') and the conductor layer (14'), respectively forming base plating layers (24', 30') via an underlayer (18') on conductor pads (14a', 14b') in openings (16a', 16b') formed in the solder resist layer (16'), and respectively forming top plating layers (28', 34') via intermediate layers (26', 32') on the base plating layers (24', 30'), since the underlayer (18') is formed of a metal different from those of the conductor pads (14a', 14b') and the base plating layers (24', 30'), there is a problem that the base plating layers (24', 30') cannot have a sufficiently high connection reliability with respect to the conductor pads (14a', 14b').

A printed wiring board according to an embodiment of the present invention includes: a base insulating layer; a conductor layer that is formed on the base insulating layer and includes conductor pads; an underlayer that is formed on one of the conductor pads of the conductor layer and includes a metal different from a metal of the conductor layer; a solder resist layer that is formed on the base insulating layer and on the conductor layer and has openings exposing portions of the conductor layer as conductor pads, respectively; a bump that is directly formed on a first conductor pad of the conductor pads. The bump has: a base plating layer that is formed in a first opening of the openings and is formed of the same metal as the conductor layer; and a top plating layer that is formed on the base plating layer.

Further, a method for manufacturing a printed wiring board according to an embodiment of the present invention includes: forming a conductor layer on a base insulating layer such that the conductor layer includes conductor pads; forming a solder resist layer on the base insulating layer such that the solder resist layer covers the conductor layer and that the solder resist layer has openings exposing the conductor pads, respectively; forming on one of the conductor pads of the conductor layer an underlayer including a metal that is different from a metal of the conductor layer; and forming directly on a first conductor pad of the conductor pads a bump including a base plating layer and a top plating layer. The forming of the bump includes forming the base plating layer in a first opening of the openings and forming the top plating layer on the base plating layer such that a metal of the base plating layer is same as the metal of the conductor layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a base insulating layer;
   a conductor layer formed on the base insulating layer and including a plurality of conductor pads;
   a solder resist layer formed on the base insulating layer such that the solder resist layer is covering the conductor layer and has a plurality of openings exposing the plurality of conductor pads, respectively;
   a bump formed directly on a first conductor pad of the plurality of conductor pads and comprising a base plating layer and a top plating layer formed on the base plating layer; and
   an underlayer formed directly on a second conductor pad of the plurality of conductor pads in the conductor layer and comprising a metal different from a metal of the conductor layer,
   wherein the bump is formed such that the base plating layer is formed in an opening of the plurality of openings and that a metal of the base plating layer is same as the metal of the conductor layer, and a bump that is same as the bump formed on the first conductor pad is not formed on the underlayer on the second conductor pad.

2. The printed wiring board according to claim 1, wherein each of the metals of the conductor layer and the base plating layer of the bump includes a main component comprising copper.

3. The printed wiring board according to claim 1, wherein the bump includes an intermediate layer comprising a nickel layer and formed between the base plating layer and the top plating layer.

4. The printed wiring board according to claim 1, wherein the top plating layer of the bump comprises a main component comprising tin.

5. The printed wiring board according to claim 1, wherein the underlayer includes a nickel layer, a palladium layer and a gold layer such that the nickel layer, the palladium layer and the gold layer are sequentially laminated.

6. The printed wiring board according to claim 1, wherein the underlayer includes nickel layer and a gold layer such that the nickel layer and the gold layer are sequentially laminated.

7. The printed wiring board according to claim 2, wherein the bump includes an intermediate layer comprising a nickel layer and formed between the base plating layer and the top plating layer.

8. The printed wiring board according to claim 2, wherein the top plating layer of the bump comprises a main component comprising tin.

9. The printed wiring board according to claim 2, wherein the underlayer formed on the second conductor pad includes a nickel layer, a palladium layer and a gold layer such that the nickel layer, the palladium layer and the gold layer are sequentially laminated.

10. The printed wiring board according to claim 2, wherein the underlayer formed on the second conductor pad includes a nickel layer and a gold layer such that the nickel layer and the gold layer are sequentially laminated.

11. The printed wiring board according to claim 3, wherein the top plating layer of the bump comprises a main component comprising tin.

12. The printed wiring board according to claim 7, wherein the top plating layer of the bump comprises a main component comprising tin.

13. A method for manufacturing a printed wiring board, comprising:
    forming a conductor layer on a base insulating layer such that the conductor layer includes a plurality of conductor pads;
    forming a solder resist layer on the base insulating layer such that the solder resist layer covers the conductor layer and that the solder resist layer has a plurality of openings exposing the plurality of conductor pads, respectively;
    forming directly on a first conductor pad of the plurality of conductor pads a bump comprising a base plating layer and a top plating layer; and
    forming directly on a second conductor pad of the plurality of conductor pads an underlayer comprising a metal that is different from a metal of the conductor layer,
    wherein the forming of the bump includes forming the base plating layer in an opening of the plurality of openings and forming the top plating layer on the base plating layer such that a metal of the base plating layer is same as the metal of the conductor layer, and a bump that is same as the bump formed on the first conductor pad is not formed on the underlayer on the second conductor pad.

14. The method for manufacturing a printed wiring board according to claim 13, wherein the forming of the bump includes reflowing the top plating layer such that the top plating layer forms a substantially hemispherical shape.

15. The method for manufacturing a printed wiring board according to claim 13, wherein the forming of the solder resist layer comprises forming a second opening of the plurality of openings such that the second opening exposes the second conductor pad of the plurality of conductor pads, and forming the opening of the plurality of openings after the forming of the second opening of the plurality of openings such that the base plating layer of the bump is formed in the opening, and the forming of the underlayer comprises forming the underlayer before the forming of the opening of the plurality of openings in the solder resist layer.

16. The method for manufacturing a printed wiring board according to claim 13, wherein each of the metals of the conductor layer and the base plating layer of the bump includes a main component comprising copper.

17. The method for manufacturing a printed wiring board according to claim 13, wherein the forming of the bump includes forming an intermediate layer comprising a nickel layer such that the intermediate layer is interposed between the base plating layer and the top plating layer.

18. The method for manufacturing a printed wiring board according to claim 13, wherein the top plating layer of the bump comprises a main component comprising tin.

19. The method for manufacturing a printed wiring board according to claim 13, wherein the forming of the underlayer on the second conductor pad includes forming a nickel layer, a palladium layer and a gold layer such that the nickel layer, the palladium layer and the gold layer are sequentially laminated.

20. The method for manufacturing a printed wiring board according to claim 13, wherein the forming of the underlayer on the second conductor pad includes forming a nickel layer and a gold layer such that the nickel layer and the gold layer are sequentially laminated.

* * * * *